(12) United States Patent
Logiudice et al.

(10) Patent No.: US 7,411,770 B2
(45) Date of Patent: Aug. 12, 2008

(54) CIRCUIT ARRANGEMENT WITH AT LEAST TWO SEMICONDUCTOR SWITCHES AND A CENTRAL OVERVOLTAGE PROTECTION

(75) Inventors: Andrea Logiudice, Padua (IT); Salvatore Giovanni Pastorina, Catania (IT); Andrea Scenini, Abano Terme (IT); Bernhard Wotruba, Padua (IT)

(73) Assignee: Infineon Technologies AG, Munich (DE)

( * ) Notice: Subject to any disclaimer, the term of this patent is extended or adjusted under 35 U.S.C. 154(b) by 337 days.

(21) Appl. No.: 11/364,835

(22) Filed: Feb. 28, 2006

(65) Prior Publication Data

US 2007/0103830 A1      May 10, 2007

(30) Foreign Application Priority Data

Nov. 4, 2005    (EP)    ................... 05024090

(51) Int. Cl.
*H02H 9/04* (2006.01)
(52) U.S. Cl. ..................... 361/91.1; 361/91.6
(58) Field of Classification Search .............. 361/23, 361/91.1, 91.6; 327/309
See application file for complete search history.

(56) References Cited

U.S. PATENT DOCUMENTS

2005/0088216 A1    4/2005    Arndt et al.

FOREIGN PATENT DOCUMENTS

DE    422 54 08 C1    4/1994

OTHER PUBLICATIONS

"HITFET® BTS 3410 G." Infineon Technologies AG: Munich, 2004 <www.infineon.com/hitfet> (11 Pages).

*Primary Examiner*—Michael Sherry
*Assistant Examiner*—Danny Nguyen
(74) *Attorney, Agent, or Firm*—Maginot, Moore & Beck

(57) ABSTRACT

A circuit arrangement includes a first semiconductor switch and at least one second semiconductor switch, each of them having a control terminal and a first and second load terminal, and with an overvoltage protection arrangement for the at least two semiconductor switches. The overvoltage protection arrangement comprises a voltage limiting unit with a first and a second terminal, whose first terminal is connected to a central circuit node, whose second terminal is connected to a terminal for a reference potential, and which is configured so that it conducts current when a threshold voltage is applied between the first and second load terminals. The central circuit node is coupled to the first load terminals of the semiconductor switches. The overvoltage protection arrangement further comprises a first actuating circuit for the first semiconductor switch and a second actuating circuit for the at least one second semiconductor switch.

18 Claims, 5 Drawing Sheets

PRIOR ART

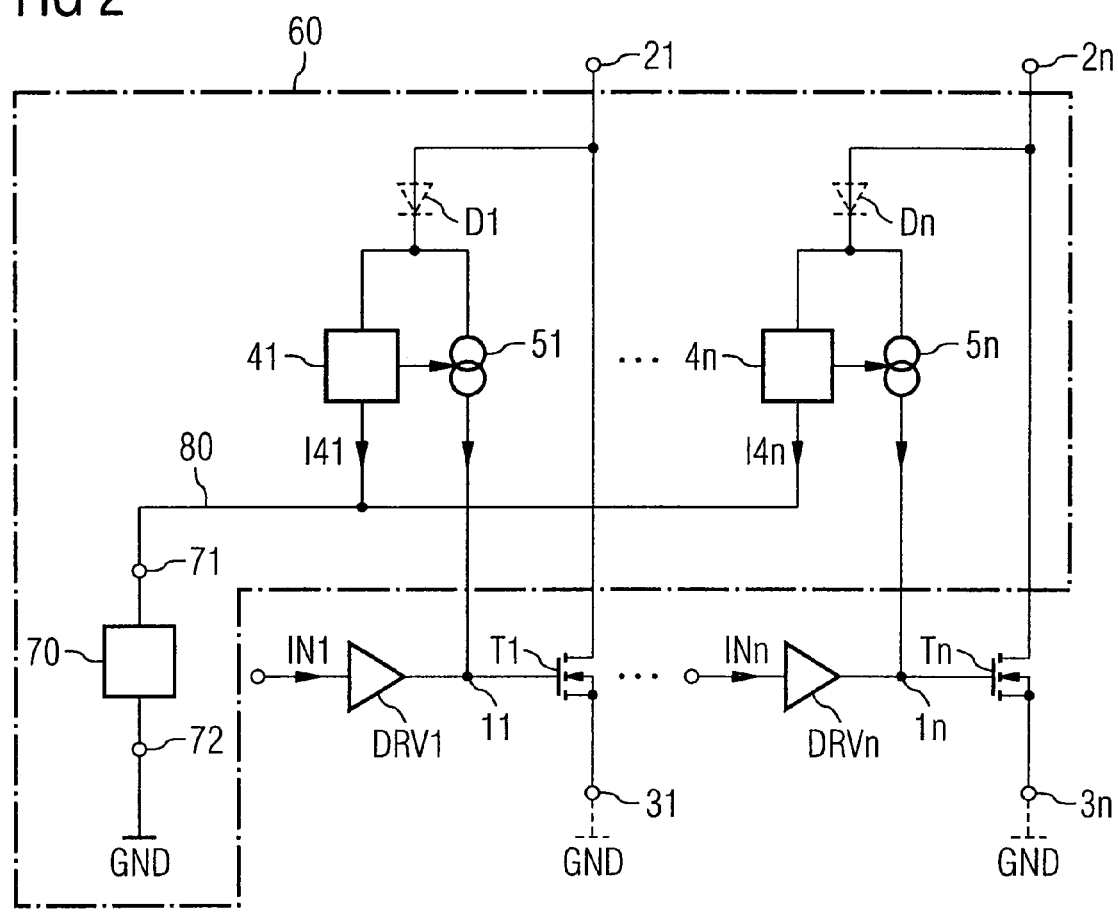

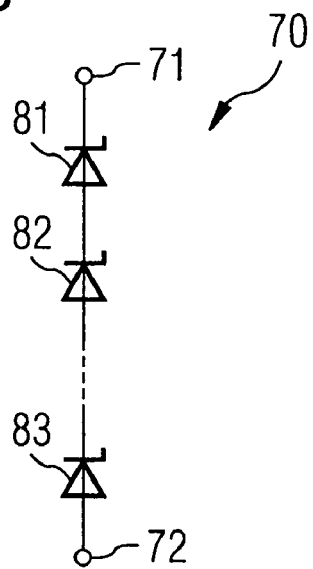
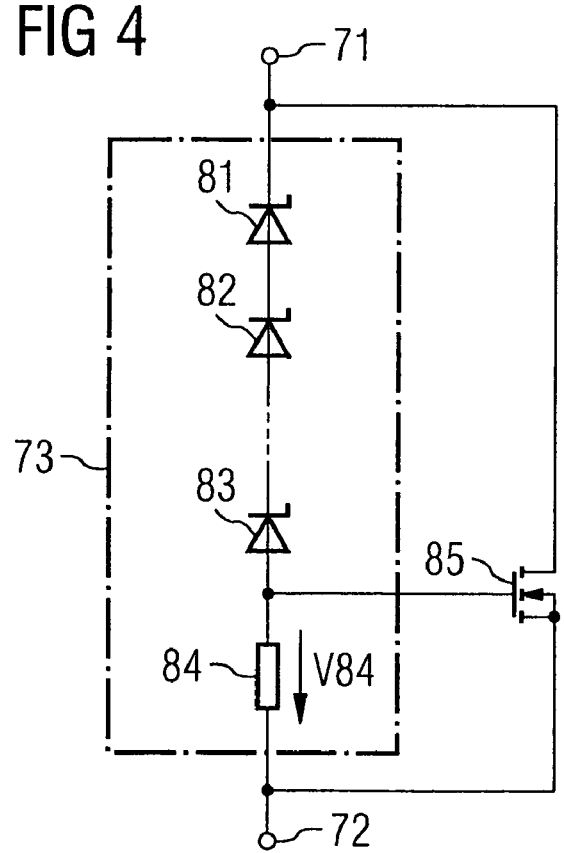

CIRCUIT ARRANGEMENT WITH AT LEAST TWO SEMICONDUCTOR SWITCHES AND A CENTRAL OVERVOLTAGE PROTECTION

BACKGROUND

The present invention relates to a circuit arrangement with at least two semiconductor switches and with an overvoltage protection for the at least two semiconductor switches.

Semiconductor switches such as MOSFETs or IGBTs are being used increasingly for switching electrical loads, such as switching electrical consumers in motor vehicles. In order to be able to actuate several consumers by means of a single integrated circuit, several semiconductor switches, in particular several power MOSFETs, are integrated in a semiconductor chip. An integrated circuit with two power MOSFETs integrated in a chip is, for example, the integrated circuit HITFET@ BTS 3410 G, which is described in data sheet 2004-03-05 of Infineon Technologies AG, Munich.

Such an integrated circuit with several semiconductor switches has circuits available separately for each of the semiconductor switches. Such circuits are, for example, driver circuits, one of which is assigned to each semiconductor switch, or protection circuits, such as current limiting circuits, overheating circuits, overvoltage protection circuits, or circuits to prevent overloading, one of each being assigned to each semiconductor switch.

The overvoltage protection circuits are, in particular, protection circuits working on the principle of "active Zenering". This principle is likewise presented in the above-mentioned data sheet for the BTS 3410 G and will be explained hereinbelow with reference to FIG. 1.

FIG. 1 shows a circuit arrangement with two semiconductor switches T1, Tn, configured as a MOSFET, each of them having one control terminal 11, 1n as well as first load terminals 21, 2n and second load terminals 31, 3n. Semiconductor switches T1, Tn are actuated via driver circuits DRV1, DRVn depending on input signals IN1, INn fed to the driver circuits DRV1, DRVn. The semiconductor switches T1, Tn and the driver circuits DRV1, DRVn are integrated together in a semiconductor chip, as is indicated in FIG. 1 schematically by the dot-and-dash line indicated as 10.

To protect the semiconductor switches T1, Tn against an overvoltage between their load terminals 21, 31 and 2n, 3n, each of the semiconductor switches T1, Tn has a protection circuit with a diode D1, Dn and a Zener diode Z1, Zn, which are connected between the first load terminals 21, 2n and the control terminals 11, 1n of the semiconductor switches T1, Tn. If, during the operation of this semiconductor switch, an electrical potential at the first load terminal 21, 2n rises to a value lying above the potential on the control terminals 11, 1n by the value of the breakthrough voltage of the Zener diodes Z1, Zn of the protection circuits, the semiconductor switches T1, Tn will be biased into conduction, thereby preventing a further rise in the voltage across their loads and protecting the semiconductor switches T1, Tn against overvoltage.

The drawback in the solution explained by FIG. 1 is that a separate overvoltage protection circuit has to be provided for each semiconductor switch, which requires a not insignificant surface area on the semiconductor chip to produce the protection circuits. This problem becomes worse with increasing number of semiconductor switches being integrated together in a single chip.

Another problem with providing separate overvoltage protection circuits for the at least two semiconductor switches can arise in the situation represented by the dotted line in FIG. 1, when the two semiconductor switches T1, Tn jointly actuate an inductive load L. The load in this case is connected between a terminal for a positive power supply potential V+ and the first load terminals 21, 2n of the two semiconductor switches T1, Tn, while the second load terminals 31, 3n of the semiconductor switches T1, Tn lie at a reference potential GND. Thus, the two semiconductor switches T1, Tn are connected up in parallel for the actuation of the inductive load L. Such a parallel circuit can be required when the current uptake of the load L is higher than the maximum allowable current load of one of the semiconductor switches T1, Tn.

If, in this circuit configuration, the two semiconductor switches T1, Tn are caused to go into conduction, a load current will flow through the inductive load, being shared between the two semiconductor switches T1, Tn. If the two semiconductor switches T1, Tn are then switched off, the voltage on their first load terminals 21, 2n will rise on account of the energy accumulated in the inductive load. If this potential reaches a value where the Zener diodes Z1, Zn conduct a current to the control terminals 11, 1n of the semiconductor switches T1, Tn, the two semiconductor switches T1, Tn will go into conduction to prevent a further rise in the electrical potential at the first load terminals 21, 2n and commutate the inductive load away.

If the Zener diodes Z1, Zn differ in their breakthrough voltage due to manufacturing variations, an operating situation may result in which one of the two semiconductor switches T1, Tn is conducting, while the other is still blocking. The conducting semiconductor switch will then have the entire commutation current of the inductive load flowing through it which can result in an overstress that can lead to destruction of this semiconductor switch. In this connection, it should be noted that, instead of only one Zener diode, it is customary to provide series circuits of several Zener diodes, which somewhat aggravates the problem of manufacturing-caused variations.

An advantage of the present invention is to provide a circuit arrangement with at least two semiconductor switches and an overvoltage protection arrangement in which the overvoltage protection arrangement is economical in space and in which the at least two semiconductor switches are reliably protected against overvoltages.

SUMMARY

The circuit arrangement according to the invention comprises a first semiconductor switch and at least one second semiconductor switch, each of them having a control terminal and a first and a second load terminal, and an overvoltage protection arrangement for the at least two semiconductor switches. The overvoltage protection arrangement has a voltage limiting unit with a first and a second terminal," whose first terminal is connected to a central circuit node and whose second terminal is connected to a terminal for a reference potential. The voltage limiting unit is configured so that, when a predetermined threshold voltage is applied between the first and second load terminals, it conducts a current. The overvoltage protection arrangement, furthermore, has a first actuating circuit for the first semiconductor switch and a second actuating circuit for the at least one second semiconductor switch. Each of these actuating circuits comprises a current sensor, which is connected between the first load terminal of the particular semiconductor switch and the central circuit node, and a current source which is actuated by the current sensor, being connected to the control terminal of the particular semiconductor switch.

In this overvoltage protection arrangement, where the voltage limiting unit is coupled via the central circuit node to the first load terminals of the semiconductor switches, the voltage limiting unit conducts a current when the potential at the first load terminal rises by the value of the threshold voltage of the voltage limiting unit above the value of a reference potential. This current flowing across the voltage limiting unit serves the purpose, via the current sensor and the current source of the actuating circuit belonging to this semiconductor switch, of biasing this semiconductor switch into conduction in order to counteract a further rising of the potential of the load portion of the circuit.

The voltage limiting unit in this circuit arrangement can comprise a Zener diode or a series connection with several Zener diodes. The breakthrough voltage of this Zener diode or of the series connection with several Zener diodes will determine the threshold voltage at which a current will flow from the central circuit node, to which all of the first load terminals of the semiconductor switches are connected to, across the voltage limiting unit.

As an alternative, it is possible to provide an additional semiconductor switch in the voltage limiting unit, which is actuated by a Zener diode or by a series connection with several Zener diodes.

In one embodiment, the current sensor and the current source of the actuating circuit of a semiconductor switch are realized such that they form a current mirror, which maps a current flowing from the first load terminal of the particular semiconductor switch to the central circuit node onto a current at the control terminal of the particular semiconductor switch.

In another embodiment, the current sensor of the actuating circuit of a semiconductor switch is realized as a resistor and the current source as a transistor, which is controlled by a voltage drop across the resistor.

BRIEF DESCRIPTION OF THE DRAWINGS

The present invention will now be explained in greater detail with reference to the drawings.

FIG. 2 shows the electrical equivalent diagram of a circuit arrangement according to the invention with at least two semiconductor switches, having a central overvoltage protection arrangement for the semiconductor switches.

FIG. 3 shows a first exemplary embodiment of a voltage limiting unit of the overvoltage protection arrangement.

FIG. 4 shows a second exemplary embodiment of a voltage limiting unit of the overvoltage protection arrangement.

In the figures, unless otherwise stated, the same reference numbers designate the same circuit components and signals with the same meaning.

DESCRIPTION

Figure 1:
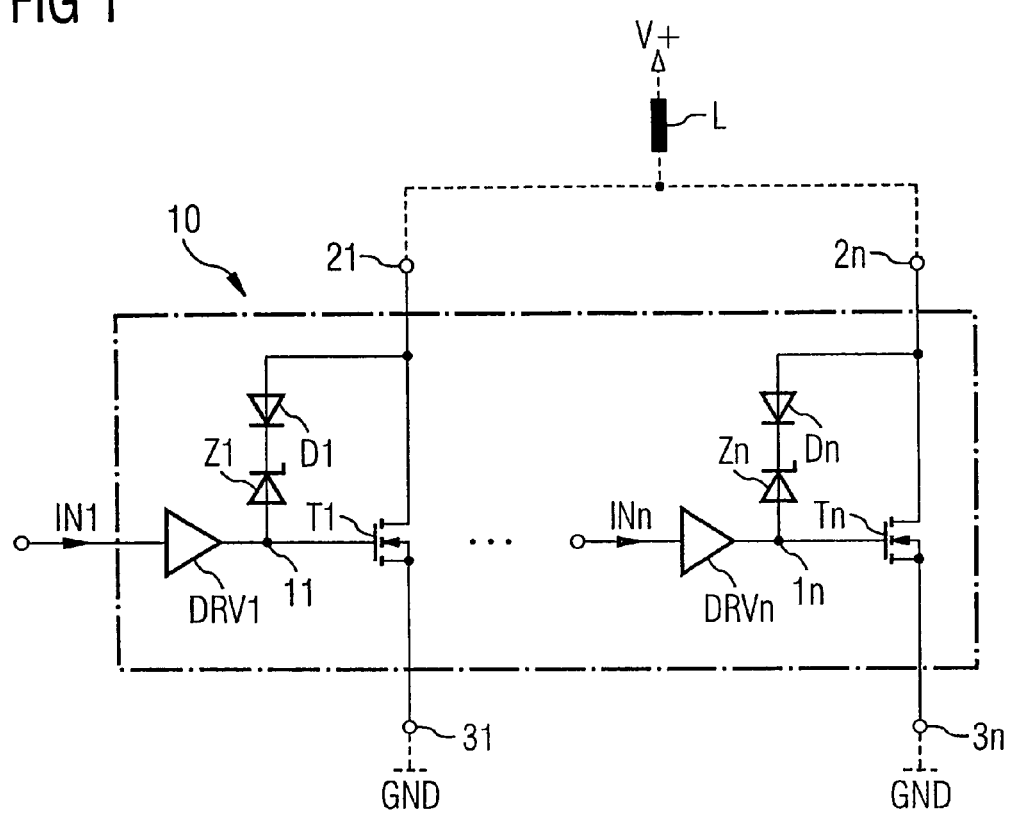
FIG. 1 shows a circuit arrangement with two semiconductor switches according to the prior art, each of which is connected to its own overvoltage protection circuit.

FIG. 2 shows a first exemplary embodiment of a circuit arrangement according to the invention, having two semiconductor switches T1, Tn, each of which has a control terminal 11, 1n, a first load terminal 21, 2n and a second load terminal 31, 3n. The semiconductor switches T1, Tn in the example are realized as n-channel-MOSFETs, whose drain terminals form the first load terminals 21, 2n, whose source terminals form the second load terminals 31, 3n and whose gate terminals form the control terminals 11, In. The semiconductor switches T1, Tn in the example are connected as low-side switches.

To each of the control terminals 11, 1n of these semiconductor switches T1, Tn driver circuits DRV1, DRVn are connected, which serve to convert actuating signals IN1, INn, by which the semiconductor switches T1, Tn are to be made conducting or blocking, to suitable levels for actuating these semiconductor switches T1, Tn.

The two semiconductor switches T1, Tn can be actuated separately from each other via the actuating signals IN1, INn and thereby serve to actuate different loads, not shown in greater detail in FIG. 2, independently of each other. These loads are to be connected in series with the load paths of the semiconductor switches T1, Tn with these series circuits are to be connected between terminals for a power supply potential and a reference potential.

The two semiconductor switches T1, Tn and their driver circuits DRV1, DRVn are integrated in a manner not depicted in greater detail, preferably jointly in a semiconductor body or a semiconductor chip.

A common overvoltage protection circuit 60 is provided to protect the two semiconductor switches T1, Tn against overvoltage on their load sections. This overvoltage protection circuit 60 comprises a voltage limiting unit 70 with a first and a second terminal 71, 72, the first terminal 71 being connected to a central circuit node 80 and the second terminal 72 being connected to a terminal for a reference potential GND. This reference potential GND can be, in particular, the reference potential to which all voltages are referred in an application circuit in which the depicted circuit arrangement is employed. This reference potential GND can be, in particular, the ground potential.

The first terminal 71 of the voltage limiting unit is coupled via the central circuit node 80 to the first load terminals 21, 2n of the semiconductor switches T1, Tn. Between each of the first load terminals 21, 2n and the central circuit node 80 there is connected a current sensor 41, 4n. Each of these current sensors 41, 4n actuates a current source 51, 5n, which is connected to the control terminal 11, 1n of the respective semiconductor switch T1, Tn. These current sources 51, 5n in the example shown are connected between the first load terminals 21, 2n and the control terminals 11, 1n of the semiconductor switches T1, Tn and are thus energized by the potential at the first load terminals 21, 2n.

In a manner not shown in greater detail, it is also possible to connect the terminals 51, 5n of the current sources away from the control terminals 11, 1n to a different power supply potential than the load potentials of the first semiconductor switches 21, 2n, which must be chosen such that it is sufficient to actuate the semiconductor switches in conduction.

In the context of the present invention, "current source" signifies a circuit arrangement that is controlled by one of the current sensors and furnishes a current to the control terminal of the respective semiconductor switch. This current source can also be realized, in a manner not specifically illustrated, as a switch that is controlled by the respective current sensor and whose load path is connected between a terminal for a power supply potential and the control terminal of the respective semiconductor switch.

Optionally, rectifiers D1, Dn are connected between the first load terminals 21, 2n and the current sensors 41, 4n. These rectifiers D1, Dn are realized in the example of FIG. 2 as diodes and during operating states where the semiconductor switches T1, Tn are actuated into conduction via the driver circuits DRV1, DRVn they prevent the charge of the gate electrodes of the MOSFETs T1, Tn from flowing away across their load section and they prevent a current from flowing away from the central circuit node 80 across the load paths of the semiconductor switches T1, Tn.

The functioning of the circuit arrangement depicted in FIG. 2 will now be explained by means of the first semiconductor switch T1 and its actuation circuit, which comprises the current sensor 41 and the current source 51. For this, let it first be assumed that the semiconductor switch T1 is actuated into blocking via the actuation signal IN1 and the driver circuit DRV1. If, during this process, the load potential at the first load terminal 21—for example, due to an inductive load connected to it—increases to a value that corresponds to the threshold voltage of the voltage limiting unit 70 plus the forward voltage of the diode D1, a current I41 will flow from the first load terminal 21 across the diode D1, the current sensor 41, and the voltage limiting unit 70 to reference potential GND. The current sensor 41 detects this current flow and actuates the current source 51, so that the latter delivers a current I51 to the control terminal 11 of the semiconductor switch T1. The semiconductor switch T1 is thereby biased into conduction so as to counteract any further rise in the load potential or, in case of an inductive load connected to the first load terminal 21, to commutate this inductive load away.

The overvoltage protection function explained above operates accordingly for the second semiconductor switch Tn, when a potential rises at the first load terminal 2n of this second semiconductor switch Tn. In this case, the current sensor 4n actuates the current source 5n hooked up to the control terminal in of this semiconductor switch Tn, thereby biasing the semiconductor switch Tn into conduction. The overvoltage protection function in this overvoltage protection circuit is also present when the load potentials at both semiconductor switches T1, Tn increase to values above the threshold voltage of the voltage limiting unit 70. In this case, currents flow from both first load terminals 21, 2n across the diodes D1, Dn and the current sensors 41, 4n as well as the voltage limiting unit 70 to reference potential GND. These currents are detected by the current sensors 41, 4n, which in turn actuate the current sources 51, 5n.

The circuit arrangement depicted in FIG. 2 contains two "channels", each with a semiconductor switch. This circuit, of course, can be expanded to more than two semiconductor switches T1, Tn, as suggested in FIG. 2. Each "channel" added in addition to this circuit comprises a semiconductor switch with a driver circuit, as well as an actuating circuit, having a current sensor and a current source. The current sensor is connected, similarly to the current sensors 41, 4n presented in FIG. 2, between a first load terminal of this additional semiconductor switch and the central circuit node 80.

FIG. 3 shows one possible exemplary embodiment for the voltage limiting unit 70. The voltage limiting unit in this case has a series circuit with several Zener diodes 81, 82, 83, being connected between the first and second terminals 71, 72. The breakthrough voltage of this series circuit with several Zener diodes 81, 82, 83 determines the threshold voltage at which the voltage limiting unit 70 will conduct a current between the first and second terminal 71, 72.

FIG. 4 shows another exemplary embodiment of such a voltage limiting unit. The voltage limiting unit in this case has a series circuit of several Zener diodes 81, 82, 83 and a resistor 84 between the first and second terminals 71, 72. Connected in parallel with this series circuit is the load path of another semiconductor switch, in the example an n-channel MOSFET 85. This MOSFET 85 is actuated by a voltage V84 across the resistor 84 and is conducting when the voltage between the first and second terminals 71, 72 is larger than the breakthrough voltage of the Zener diode chain 81-83 plus the threshold voltage of the MOSFET 85. Since the threshold resistance of the MOSFET 85 is lower than the forward resistance of the Zener diode chain operating in the blocking direction, the MOSFET 85 takes up the main share of the current flowing between the first and second terminals 71, 72. The current load on the Zener diodes 81-83 is therefore less than the current load on the Zener diodes in a voltage limiting unit according to FIG. 3, so that in the voltage limiting unit according to FIG. 4 the Zener diodes 81-83 can be smaller in dimension that the corresponding Zener diodes in the circuit of FIG. 3. Despite the additional MOSFET 85, the voltage limiting unit of FIG. 4 is more space-saving. Furthermore, the clamping voltage of the voltage limiting unit 73 in FIG. 4 is less dependent on the currents I41, . . . , I4n flowing into the voltage limiting unit 73.

Figure 5:
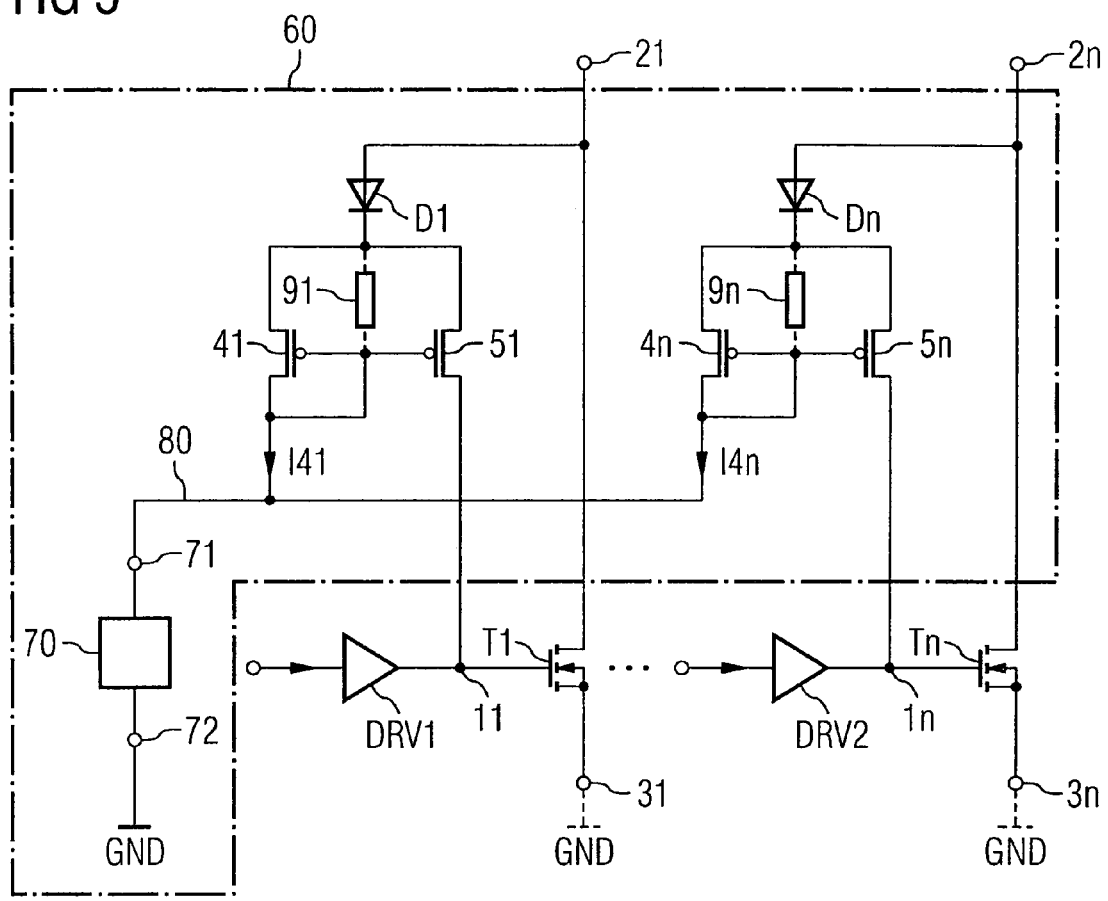
FIG. 5 shows a second exemplary embodiment of a circuit arrangement according to the invention.

FIG. 5 shows an exemplary embodiment of a circuit according to the invention, in which a current sensor 41 and a current source 51 are jointly realized as current mirrors. The current sensor 41 in this case forms an input transistor of the current mirror, while the current source 51 forms an output transistor of this current mirror. A current I41 flowing through the input transistor 41 is mapped in this arrangement via the output transistor 51 onto a current I51 at the control terminal 11 of the semiconductor switch T1. The current mirror 41, 51 can be of such a dimension that the current I41 corresponds to the current I51. Moreover, it is possible to adjust the output current I51 of the current mirror through the surface ratio of the transistors 41, 51 forming the current mirror to a value proportional to the input current I41. The two current mirror transistors in the depicted example are configured as p-channel MOSFETs, of which the input transistor 41 is wired as a diode.

Figure 6:
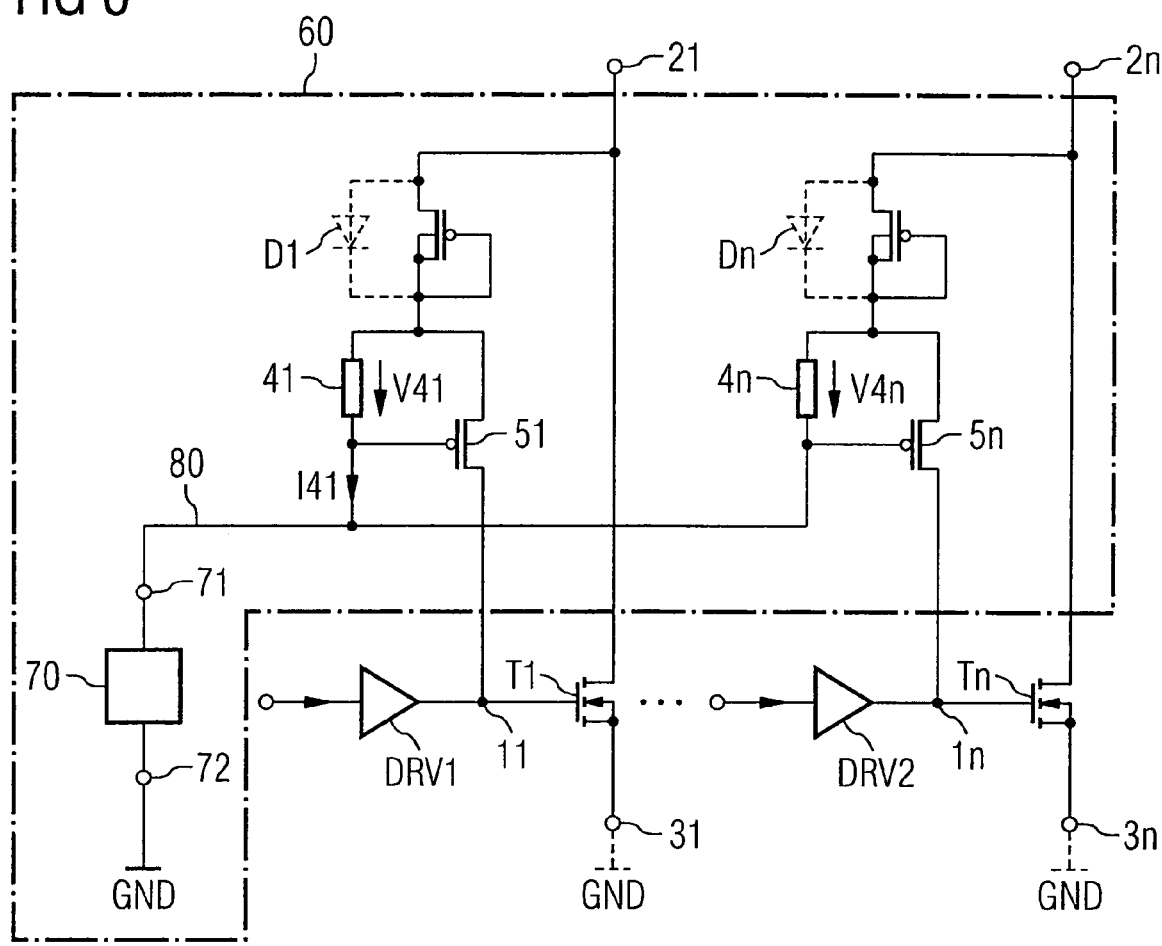
FIG. 6 shows a third exemplary embodiment of a circuit arrangement according to the invention.

Another exemplary embodiment of the current sensors and the current sources is given in FIG. 6. In this exemplary embodiment, the current sensor 41 of an actuating circuit is realized as an ohmic resistor, which are connected between the first load terminal 21 of the respective semiconductor switch T1 and the central circuit node 80. A current I41 flowing across this resistor 41 in event of an overload causes a voltage drop V41 across this resistor, which serves to actuate a transistor 51, whose load is connected between the first load terminal 21 and the control terminal 11 of the respective semiconductor switch T1. The transistor 51, 5n in this circuit according to FIG. 6 functions as a current source and is configured in the example as a p-channel MOSFET.

Also a mixed solution comprising a current mirror and a resistor may be used as a current sensor. Referring to FIG. 5 resistors 91, 9n may be connected between the rectifier elements D1, Dn and the gate terminals of the current mirror output transistors 51, 5n. These resistors serve to increase the robustness of the current sensors.

In the exemplary embodiment of FIG. 6 the diodes D1, Dn are realized using the parasitic bulk—drain junction of a PMOS transistors. This permits an area saving since the diodes/rectifiers D1, Dn and the current sources 51, 5n can be placed into the same bulk.

The above-described overvoltage protection arrangement of the circuit according to the invention merely requires, for protection of the semiconductor switches, a voltage limiting unit realized by using one or more Zener diodes. This overvoltage protection arrangement has the benefit of being space-saving, given the need to provide only one voltage limiting unit. Furthermore, no problems caused by manufacturing variations can arise in this overvoltage protection arrangement.

LIST OF REFERENCE NUMBERS

V+ positive power supply potential
GND reference potential
IN1, INn input signals
DRV1, DRVn driver circuits
L inductive load
11, 1n control terminals, gate terminals
Z1, Zn Zener diodes
D1, Dn diodes
21, 2n first load terminals
31, 3n second load terminals
T1, Tn semiconductor switches, n-channel-MOSFET
60 overvoltage protection arrangement
80 central circuit node
70 voltage limiting unit
71, 72 terminals of the voltage limiting unit
81-83 Zener diodes
84 resistor
V84 voltage
85 semiconductor switch, n-channel-MOSFET
91, 9n resistors
I41, I4n currents
V41, V4n voltages

The invention claimed is:

1. A circuit arrangement comprising:
a plurality of semiconductor switches including a first semiconductor switch and at least one second semiconductor switch, each of the plurality of semiconductor switches including a control terminal, a first load terminal, and second load terminal; and
an overvoltage protection arrangement for the plurality of semiconductor switches, the overvoltage protection arrangement comprising
a voltage limiting unit including a first terminal and a second terminal, wherein the first terminal of the voltage limiting unit is connected to a central circuit node, wherein the second terminal of the voltage limiting unit is connected to a reference potential, wherein the voltage limiting unit is configured to conduct a current when a threshold voltage is applied between the first and second terminals of the voltage limiting unit, and wherein the central circuit node is coupled to the first load terminals of the plurality of semiconductor switches; and
a plurality of actuating circuits including a first actuating circuit for the first semiconductor switch and a second actuating circuit for the at least one second semiconductor switch, wherein each of the plurality of actuating circuits comprise a current sensor connected between the first load terminal of one of the plurality of semiconductor switches and the central circuit node, and a current source configured to be actuated by the current sensor, wherein the current source is connected to the control terminal of the one of the plurality of semiconductor switches.

2. The circuit arrangement of claim 1 wherein the voltage limiting unit comprises at least one Zener diode, wherein the at least one Zener diode is connected between the first terminal and the second terminal of the voltage limiting unit.

3. The circuit arrangement of claim 2 wherein the voltage limiting unit comprises a plurality of Zener diodes, wherein each of the plurality of Zener diodes include a load section, and wherein the load section of each of the plurality of Zener diodes are connected in series between the first terminal and the second terminal of the voltage limiting unit.

4. The circuit arrangement of claim 1 wherein the voltage limiting unit comprises
a semiconductor switch including a control terminal and a load section, wherein the load section is connected between the first terminal and the second terminal of the voltage limiting unit, and
an activation circuit for the semiconductor switch, wherein the activation circuit is connected between the first terminal and the second terminal of the voltage limiting unit and wherein the activation circuit is configured to make the semiconductor switch conducting depending on a voltage between the first terminal and the second terminal of the voltage limiting unit.

5. The circuit arrangement of claim 4 wherein the activation circuit of the voltage limiting unit comprises a series circuit including at least one Zener diode and a resistor, wherein the series circuit is connected between the first terminal and the second terminal of the voltage limiting unit, and wherein the control terminal of the semiconductor switch is connected to a node common to the at least one Zener diode and the resistor.

6. The circuit arrangement of claim 1 wherein the overvoltage protection circuit further comprises a plurality of rectifiers, each of the plurality of rectifiers connected between the first load terminal of one of the plurality of semiconductor switches and the central circuit node.

7. The circuit arrangement of claim 1 wherein the current sensor and the current source of at least one of the plurality of actuating circuits form a current mirror configured to map a current flowing from the first load terminal of the one of the plurality of semiconductor switches to the central circuit node onto a current at the control terminal of the one of the plurality of semiconductor switches.

8. The circuit arrangement of claim 1 wherein the current sensor of at least one of the plurality of actuating circuits comprises a resistor and the current source of said one of the plurality of actuating circuits comprises a transistor, wherein the transistor is controlled by a voltage drop across the resistor.

9. The circuit arrangement of claim 1 wherein the first semiconductor switch and the at least one second semiconductor switch are connected in parallel.

10. An overvoltage protection arrangement for a plurality of semiconductor switches, the plurality of semiconductor switches including a first semiconductor switch and a second semiconductor switch, wherein the first semiconductor switch and the second semiconductor switch each include a control terminal, a first load terminal, and a second load terminal, the overvoltage protection arrangement comprising:
a central circuit node coupled to the first load terminal of the first semiconductor switch and the first load terminal of the second semiconductor switch;
a reference node at a reference potential;
a voltage limiting unit connected between the central circuit node and the reference node, wherein the central circuit node is configured to conduct current when a threshold voltage is applied between the central circuit node and the reference node; and
a first actuating circuit for the first semiconductor switch, the first actuating circuit comprising
a first current sensor connected between the first load terminal of the first semiconductor switch and the central circuit node, and
a first current source connected to the control terminal of the first semiconductor switch, wherein the first current source is actuated by the first current sensor; and a second actuating circuit for the second semiconductor switch, the second actuating circuit comprising
a second current sensor connected between the first load terminal of the second semiconductor switch and the central circuit node, and
a second current source connected to the control terminal of the second semiconductor switch, wherein the second current source is actuated by the second current sensor.

11. The arrangement of claim 10, wherein the voltage limiting unit includes a Zener diode coupled to the central circuit node and the reference node.

12. The arrangement of claim 11 wherein the voltage limiting unit comprises a plurality of Zener diodes connected in series between the central circuit node and the reference node.

13. The arrangement of claim 10 wherein the voltage limiting unit comprises
a semiconductor switch including a control terminal and a load section, wherein the load section is connected between the central circuit node and the reference node, and
an activation circuit for the semiconductor switch, wherein the activation circuit is connected between the central circuit node and the reference node and is configured to make the semiconductor switch become conducting depending on a voltage between the central circuit node and the reference node.

14. The arrangement of claim 13 wherein the activation circuit of the voltage limiting unit comprises a series circuit with at least one Zener diode and a resistor, and wherein the control terminal of the semiconductor switch is connected to a node common to the at least one Zener diode and the resistor.

15. The arrangement of claim 10 wherein a first rectifier is connected between the first load terminal of the first semiconductor switch and the central circuit node, and a second rectifier is connected between the first load terminal of the second semiconductor switch and the central circuit node.

16. The arrangement of claim 10 wherein the first current sensor and the first current source of the first actuating circuit form a current mirror configured to map a current flowing from the first load terminal of the first semiconductor switch to the central circuit node onto a current at the control terminal of the first semiconductor switch.

17. The arrangement of claim 10 wherein the first current sensor of the first actuating circuit comprises a resistor and the first current source comprises a transistor which is controlled by a voltage drop across the resistor.

18. A circuit arrangement comprising:
a first semiconductor switch configured to actuate a first electrical load, the first semiconductor switch including a control terminal, a first load terminal and a second load terminal;
a second semiconductor switch configured to actuate a second electrical load, the second semiconductor switch including a control terminal, a first load terminal and a second load terminal and
an overvoltage protection arrangement for the first semiconductor switch and the second semiconductor switch, the overvoltage protection arrangement comprising
a means for limiting voltage across the first load terminal and second load terminal of the first semiconductor switch and the second semiconductor switch, the means for limiting voltage provided between a central circuit node and a reference potential;
a first actuating circuit for the first semiconductor switch, the first actuating circuit comprising (i) a means for sensing a current between the first load terminal of the first semiconductor switch and the central circuit node, and (ii) a means for providing a current to the control terminal of the first semiconductor switch dependent on the sensed current between the first load terminal of the first semiconductor switch and the central circuit node; and
a second actuating circuit for the second semiconductor switch, the second actuating circuit comprising (i) a means for sensing a current between the first load terminal of the second semiconductor switch and the central circuit node, and (ii) a means for providing a current to the control terminal of the second semiconductor switch dependent on the sensed current between the first load terminal of the second semiconductor switch and the central circuit node.

* * * * *